United States Patent [19]
Sorel et al.

[11] Patent Number: 5,995,205
[45] Date of Patent: Nov. 30, 1999

[54] LIGHT EXPOSURE INSTALLATION OF A DOUBLE-SIDED PRINTED CIRCUIT PLATE THROUGH ARTWORKS

[75] Inventors: Alain Sorel, Saint Croix; Serge Charbonnier, Chambray, both of France

[73] Assignee: Automa-Tech, Val De Reuil, France

[21] Appl. No.: 09/264,470

[22] Filed: Mar. 8, 1999

Related U.S. Application Data

[63] Continuation of application No. 08/856,021, May 14, 1997, Pat. No. 5,880,820.

[30] Foreign Application Priority Data

May 15, 1996 [FR] France .................................. 96 06062

[51] Int. Cl.⁶ .................................................. G03B 27/04
[52] U.S. Cl. ................................. 355/95; 355/26; 355/72; 355/75
[58] Field of Search ................................. 355/95, 26, 53, 355/72, 73, 75, 76, 91; 356/399, 400, 401; 250/491.1; 430/5

[56] References Cited

U.S. PATENT DOCUMENTS

| | | | |
|---|---|---|---|
| 4,827,316 | 5/1989 | Brown | 355/91 |
| 5,272,502 | 12/1993 | Saiki | 355/76 |
| 5,337,151 | 8/1994 | Baxter et al. | 355/53 |
| 5,403,684 | 4/1995 | Schroeder et al. | 430/5 |
| 5,548,372 | 8/1996 | Schroeder et al. | 355/53 |

FOREIGN PATENT DOCUMENTS

918505 A1  10/1994  European Pat. Off. .

*Primary Examiner*—Alan A. Mathews
*Attorney, Agent, or Firm*—O'Melveny & Myers LLP

[57] ABSTRACT

The invention relates to a light exposure installation of a double-sided printed circuit plate through a first and a second artwork equipped with a location mark. It includes a first (10) and a second fixed supporting structure in a horizontal plane, a first and a second support of the first and second artworks (12), optical means for detecting the positioning errors between said circuit and said first and second supports, means for moving perpendicularly to its plane, one of said supports towards the other support, means (26, 28) arranged outside the unit made up of said supports and said circuit to maintain said circuit fixed in its plane with respect to said supporting structure; and means (20, 22) for moving independently said first support (12) with respect to said circuit and said second support with respect to said circuit depending on the detected positioning errors.

10 Claims, 5 Drawing Sheets

LIGHT EXPOSURE INSTALLATION OF A DOUBLE-SIDED PRINTED CIRCUIT PLATE THROUGH ARTWORKS

RELATED APPLICATION

This application is a continuation of application Ser. No. 08/856,021, filed May 14, 1997, now issued on Mar. 9, 1999, as U.S. Pat. No. 5,880,820.

The present invention relates to a light exposure installation of a double-sided printed circuit plate through artworks.

BACKGROUND OF THE INVENTION

It is common knowledge that the operations that are necessary to carry out a printed circuit board involve an insolation step, especially for the photoetching definition of strip conductors. The corresponding installation is used to expose to ultraviolet rays, during a given time, the printed circuits covered with a film or a photosensitive resist through an artwork to insolate the corresponding part of the resist or of the photosensitive film defined by this artwork.

It is naturally understood that in this operation a fundamental point consists in obtaining a precise positioning of the artwork with respect to the printed circuit on which insolation is to be made.

The great majority of this type of machines only allows for the ultraviolet exposure of one side of the printed circuit plate. However, when the printed circuit plate is of the double-sided type, which is more and more frequent, the use of such machines is not very adapted as it requires the plate to pass twice inside the exposure machine which then requires two positioning operations of the artwork on its support with respect to the printed circuit.

To overcome this drawback, some insolation machines have already been proposed which allow a simultaneous insolation through artworks of both sides of the printed circuit. Such machines are described in particular in U.S. Pat. No. 5,337,151 and in European patent application EP 618 505.

The machine described in the above-mentioned US patent, is based on the principle that consists in positioning with a mechanical centering the lower support and the upper support of artwork and in moving the artwork by means of a pair of fingers that are coupled with one another with respect to the unit made up of the lower and upper supports of artworks.

This machine has numerous drawbacks, owing particularly to the fact that the upper artwork is not positioned accurately with respect to the lower artwork and to the fact that the printed circuit cannot be precisely moved as required by means of two coupled fingers because of the risk of deflection of the fingers for moving the printed circuit.

Furthermore, this machine does not allow for the separate positioning of the upper artwork with respect to the upper side of the printed circuit and the positioning of the lower artwork with respect to the lower side of the printed circuit. Yet such a possibility can be useful in certain situations.

Concerning the European patent also mentioned above, said patent corresponds to an efficient machine insofar as the printed circuit moves with respect to the lower and upper artworks by means of two independent fingers which allow for a right positioning of the printed circuit. Also, in the machine described in this patent, there is a real positioning of the upper artwork with respect to the lower artwork. However, this machine does not allow for a separate positioning of the upper artwork with respect to the upper side of the printed circuit and a positioning of the lower artwork with respect to the lower side of the printed circuit. Further, this machine also presents risks of positioning errors because of the deflection of the fingers used for positioning the printed circuit.

To overcome these drawbacks, it is an object of the present invention to provide an installation of light exposure for a double-sided printed circuit allowing the eviction of the above-mentioned drawbacks and especially, when necessary, to achieve a separate positioning with respect to the printed circuit of the upper support of the artwork and of the lower support of the artwork.

SUMMARY OF THE INVENTION

To achieve this purpose, the installation of light exposure of a double-sided printed circuit plate through a first and a second artwork equipped with a location mark including a first and a second fixed supporting structure in a horizontal plane, a first and a second support of the first and second artworks cooperating with the first and the second supporting structures respectively, means to arrange said circuit between the first and second supports of artworks, said circuit being equipped with a position location mark, optical means for detecting the positioning errors between said circuit and said first and second supports, means for moving perpendicularly to its plane one of said supports towards the other support, a light source, optical means for simultaneously directing toward each artwork support a light beam from the beam emitted from said source;

means arranged outside the unit made up of said supports and said circuit for fixedly maintaining in its plane said circuit with respect to said supporting structure; and means for moving independently said first support with respect to said circuit and said second support with respect to said circuit depending on the detected positioning errors.

It will be understood that, thanks to the specific arrangements of the exposure installation, the printed circuit is maintained fixed with respect to the supporting structure of the machine whereby it avoids any risks of inaccurate positioning due to a deflection of the displacement means for moving the printed circuit as these fingers are fixed and, also, means enable the first support to move independently with respect to the printed circuit and the second support with respect to the printed circuit, whereby independent positionings of upper and lower artworks are obtained with respect to the printed circuit.

According to a first embodiment, the means for maintaining the printed circuit fixed include first, second and third means which form centering fingers that are integral with a horizontal plane of the lower supporting structure and which go freely through said lower support and having an end suitable for entering a corresponding location orifice provided in said circuit, with said three orifices not being aligned.

It will be understood that according to this implementation method of the invention, the centering fingers that are fixed and integral with the lower supporting structure allow for a very precise and stable positioning of the printed circuit with respect to the supporting structure of the machine and thus with respect to the upper and lower artworks embodiment.

According to a second embodiment, the means for maintaining fixed the printed circuit include a first and a second pinching unit, each pinching unit including:

a first pinching member secured to the first supporting structure and going freely through the first support and a second pinching member integral with the second supporting structure and going freely through the second support, said pinching members facing each other in the vertical direction and means for relatively moving the first and second pinching members towards each other so as to pinch the printed circuit.

It will be understood that in this embodiment, the printed circuit is pinched between two pinching members that are respectively integral with the upper and lower supporting structure. A very accurate and stable positioning of the printed circuit is thus obtained with respect to the supporting structure of the insolation installation. It is then possible from this specific position of the printed circuit to position separately the upper artwork support and the lower artwork support by means of the displacement means.

BRIEF DESCRIPTION OF THE DRAWINGS

Other characteristics and advantages of the invention will emerge on reading the following description of several embodiments of the invention given by way of non-limiting examples.

The description reefers to the attached Figures in which.

DETAILED DESCRIPTION OF THE PREFERRED EMBODIMENTS

In this type of installation, it is well known that in a first step, a pre-positioning of the printed circuit with respect to the artwork support is achieved by means of retractable positioning fingers. Once this pre-positioning of the printed circuit is achieved with respect to the upper and lower artwork supports, the positioning error of these three parts is measured by optical means. From these positioning error measurements, displacement motors are controlled to make the final positioning which must correspond to a positioning error of less than 10 microns. The present invention concerns the part of the installation allowing to obtain the final positioning from the error measurement that corresponds to the pre-positioning.

The optical detection of the positioning error has been described in detail in European patent application 618 505. For this part of the installation, reference is made to the description of this patent application which has to be considered as being an integral part of the present application. Variant embodiments and uses of the optical system for detecting the pre-positioning error will merely be specified in certain implementation methods.

Figure 1:
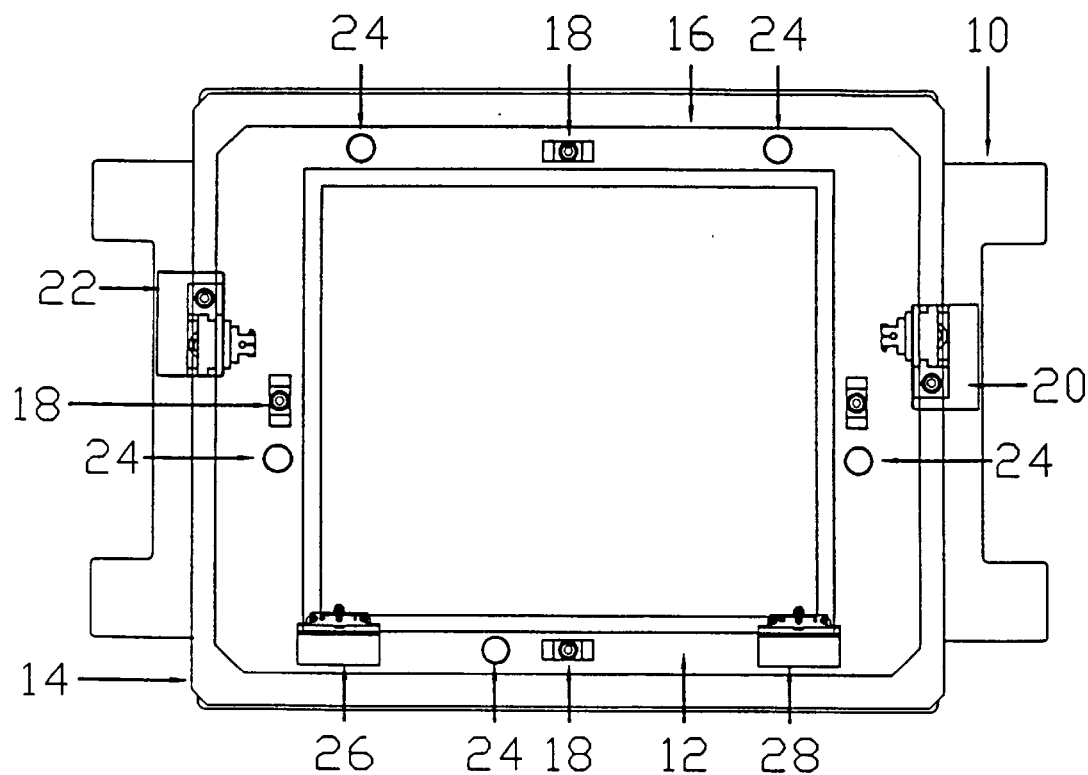
FIG. 1a is a schematic plan view of the lower part of the exposure installation showing the main members of this lower part.
FIG. 1b is a simplified cross-section view of the installation.
Figure 1:
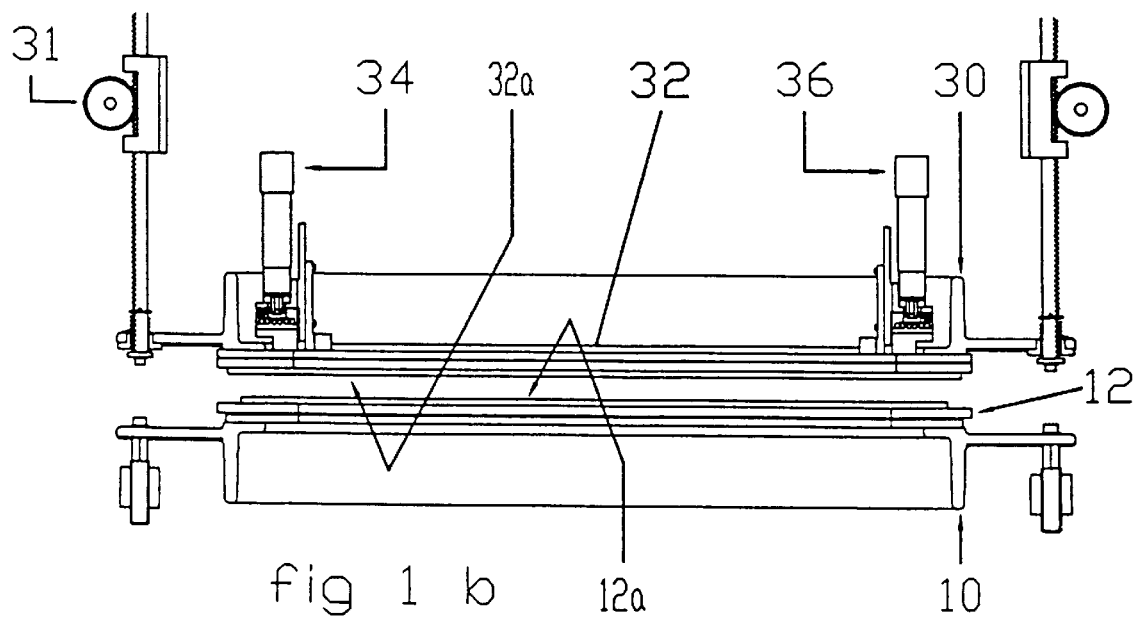

Referring first of all to FIGS. 1a and 1b, the different parts of the installation will be described and more precisely, the lower part of this installation intended for supporting the lower artwork and somehow the printed circuit.

FIG. 1a shows the fixed lower supporting structure of the machine referenced 10, as well as the lower support of artwork 12. This lower support 12 is made up of a rectangular metal frame 14 on which a glass 16 is fixed, glass on which the lower artwork indeed rests.

Preferably, in the exposure installation, the lower artwork support 12 directly rests on the upper side of the supporting structure 10. To allow the support 12 to move, it rests on the supporting structure 10 by means of ball systems schematized in 18. In this particular example, supporting is achieved via 4 balls arranged on the four sides of the frame 14. This ball system described later in more detail makes it possible for the supporting structure to mechanically support all of the lower support while ensuring supporting with a very reduced friction. It will be understood that thanks to this arrangement, the force applied to move the lower support 14 will thus be very reduced, which will allow both a reduction of power and size of the motors used to perform this displacement.

This Figure also shows schematically the devices 20 and 22 for moving respectively in X and in XY the lower support 12. As has already been explained, the displacement tables which are integral with the supporting structure 10 do not have any supporting function and are merely used to move the support with respect to the supporting structure, knowing that since the frictions between these two pieces are very low and owing to the presence of the balls, the necessary power is reduced. FIG. 1a also shows schematically electromagnetic brakes or any other similar braking system in 24. These braking systems 24 regularly distributed over the frame 14 allow to ensure the immobilization of the frame 14 and thus, of all of the lower artwork support 12 with respect to the supporting structure 10 when a correct positioning has been obtained. These braking devices 24 are made necessary because of the connection without friction between the supporting structure and the lower support and because of the very low power of the motors used for producing the displacement tables 20 and 22.

FIG. 1a shows schematically two units for immobilizing the printed circuit with respect to the lower supporting structure 10. These units are referenced 26 and 28.

The upper part of the machine is made in exactly the same way except that the lower supporting structure 10 is stationary both in a horizontal and a vertical plane although the upper structure is naturally stationary in a horizontal plane and mobile in a vertical plane so as to allow the application of the upper artwork on the printed circuit and on the lower artwork. Therefore, the upper part of the machine will not be described in detail.

FIG. 1b shows schematically a cross-section of all of the exposure installation. The fixed lower supporting structure 10 on which rests the lower support 12 intended for receiving the lower artwork 12a is shown. This Figure also shows the upper supporting structure 30 supported by mechanisms 32 such as pinion rack systems allowing all of the upper supporting structure 30 to be lowered and raised. However, this supporting structure 30 is naturally fixed in a horizontal plane. The upper support 32 that is identical to the lower support 12 and intended for receiving the upper artwork 32a is mounted on the upper support 32. FIG. 1b shows schematically the displacement motors in X and in XY referenced 34 and 36 which control the support 32 when it moves with respect to the upper supporting structure 30.

The general operation of the exposure installation according to the invention is henceforth understood.

In a first step, the upper supporting structure 30 being ignored and the artworks 12a and 32a being positioned, the printed circuit to be exposed is arranged between the supports 12 and 32. The printed circuit to be exposed is taken by means of the immobilization devices 26 and 28. With the optical systems (not represented), the pre-positioning errors of the lower support 12 and the upper support 32 with respect to the printed circuit are measured. The printed circuit being stationary, the suitable displacements of the upper support 32 and of the lower support 12 are controlled by means of motors 20, 22 and 34, 36 in order to obtain an alignment of the three elements or, as the case may be, an alignment of the upper support 32 with the upper side of the printed circuit and of the lower support 12 with the lower side of the printed circuit.

Figure 2:
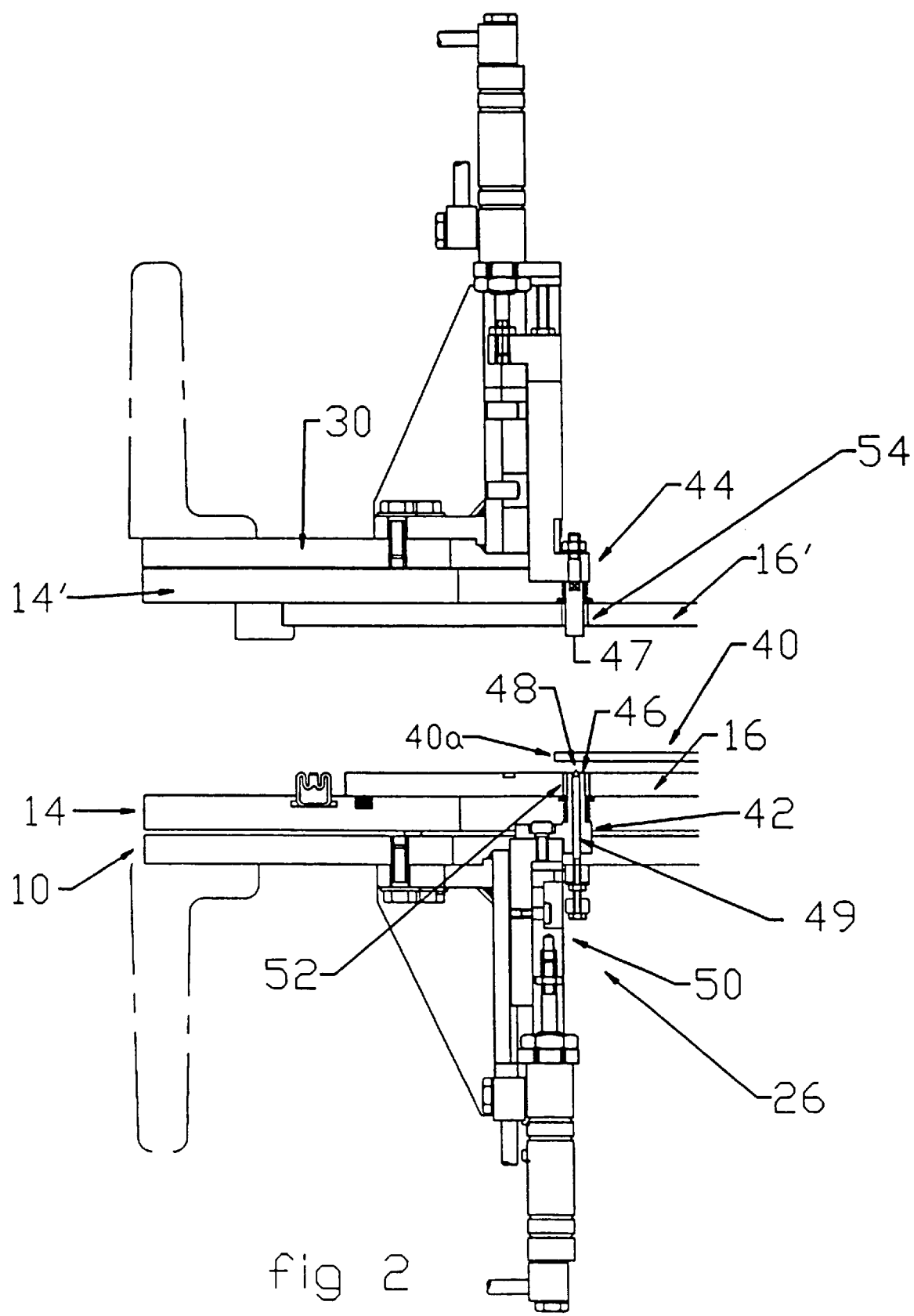
FIG. 2 is a partial view of the installation showing a pinching device for immobilizing the printed circuit.

Referring now to FIG. 2, a first embodiment of the immobilization device, for example the device 26, will be described. In this first embodiment, immobilization is achieved by selectively pinching an edge 40a of the printed circuit 40. The pinching device is essentially made up of a first piece 42 integral with the lower supporting structure 10 and with a second piece 44 integral with the upper supporting structure 30. The pieces 42 and 44 are vertically mobile with respect to respective supporting structures 10 and 30. The pieces 42 and 44 are ended with a flat pinching side 46 and 47 intended for being applied on the sides of the printed circuit 40. The lower piece 42 is equipped with a rod 49 that is mobile in a vertical translation which ends with a tip 48. In the rest position, the tip 48 is withdrawn with respect to the side 46, but by means of a displacement system 50, the tip 48 may project from the side 46.

During the positioning phase of the upper and lower supports of the exposure installation, the tip 48 projects from the piece 42. After arranging the printed circuit 40 with reference to pre-defined locations, the piece 44 is lowered such that the edge 40a of the printed circuit 40 is between the side 47 of the piece 44 and the tip 48. Thus, the printed circuit is perfectly immobilized in this point and on a very reduced surface corresponding to the tip 48. Moreover, the tip 48 projecting from the surface 46 which is level with the upper side of the glass 16, the printed circuit is raised at least at its periphery which enables the glass 16 to move with respect to the printed circuit. Of course, to enable the effective pinching of the printed circuit 40, the ends of the pieces 42 and 44 go through respective orifices 52 and 54 provided in the lower glass 16 and upper glass 16'. These orifices 52 and 54 have a diameter wide enough to allow the supports 14 and 14' to move in order to achieve alignment. The co-operation of the two immobilization devices 26 and 28 makes it possible to strictly maintain the printed circuit 40 in place with respect to the supporting structure of the installation.

Figure 3:
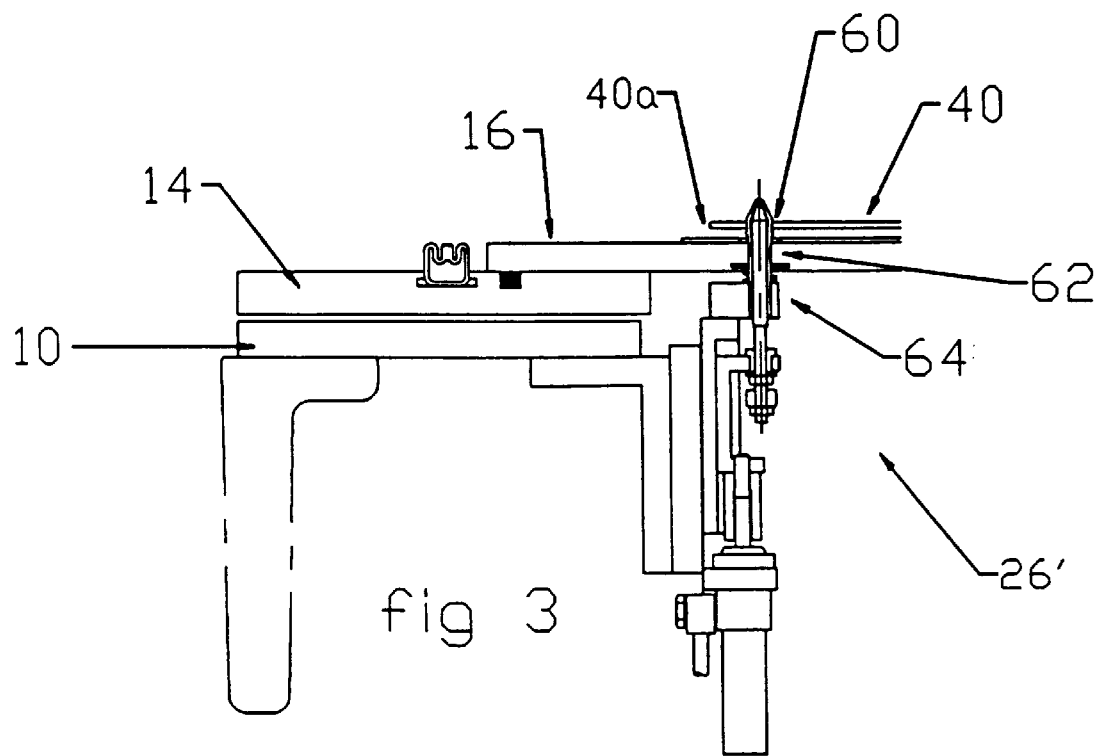
FIG. 3 is a detailed view of the installation showing the means for immobilizing the printed circuit by means of fingers.
Figure 4:
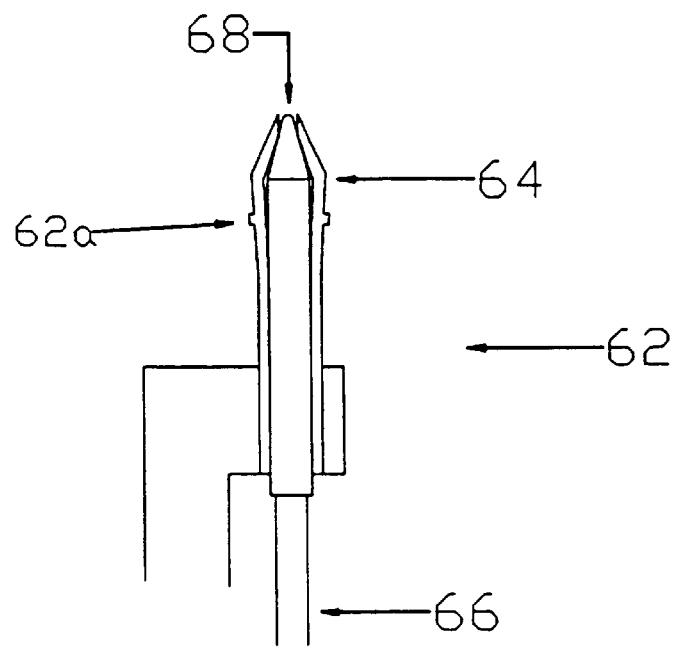
FIG. 4 is a detailed view showing the ends of the immobilization fingers of FIG. 3.

Referring now to FIGS. 3 and 4, a second embodiment of the immobilization device which has the reference 26' will be described. Such immobilization device is based on the introduction in an orifice 60 of the printed circuit 40 of an immobilization finger 62. The finger 62 is mounted so as to move in the vertical direction with respect to a piece 64 integral with the lower supporting structure 10. The immobilization finger 62 is thus mobile vertically but stationary in a horizontal plane. By introducing the end of the finger 62 in the orifice 60, an immobilization of the corresponding part of the printed circuit 40 with respect to the lower supporting structure is obtained. To obtain the complete immobilization of the printed circuit, it is necessary to provide along the edge 40a of the printed circuit three immobilization devices such as 26', said three devices not being aligned.

FIG. 4 shows a preferred embodiment of the immobilization finger 62. The body of the finger 62 extends by an expansible part 64 through elastic distortion, all of the expansible parts 64 forming the tip of the immobilization finger. The shoulder 62a is used to rise temporarily the edge of the printed circuit in order to allow the lower support to move. Inside the finger 62, an expanding rod 66 can be moved which ends with a head 68. When the head 68 is in a high position, the expansion of the end parts 64 of the finger is achieved and thus a strict immobilization of this part of the printed circuit is achieved although the immobilization orifice 60 is not perfectly calibrated.

It will be understood that the embodiments of the immobilization means of FIGS. 2 and 3 enable the same result to be obtained. However, in the case of FIG. 2, the unuseful lateral zone of the printed circuit can be reduced to a dimension of about 8 mm since it is not necessary to provide an orifice in the vicinity of the edge of the printed circuit. But in the case of the embodiment of FIG. 3, because of the presence of the orifice, this unuseful lateral zone is necessarily a little larger.

It can be added that, thanks to such immobilization systems of the printed circuit, the positioning of the printed circuit is maintained in a strict manner during the displacement phases of the lower support 12. Indeed, since both the immobilization fingers 62 and the pinching pieces 42 and 44 are stationary themselves, no deflection force can be exerted thereon.

Figure 5:
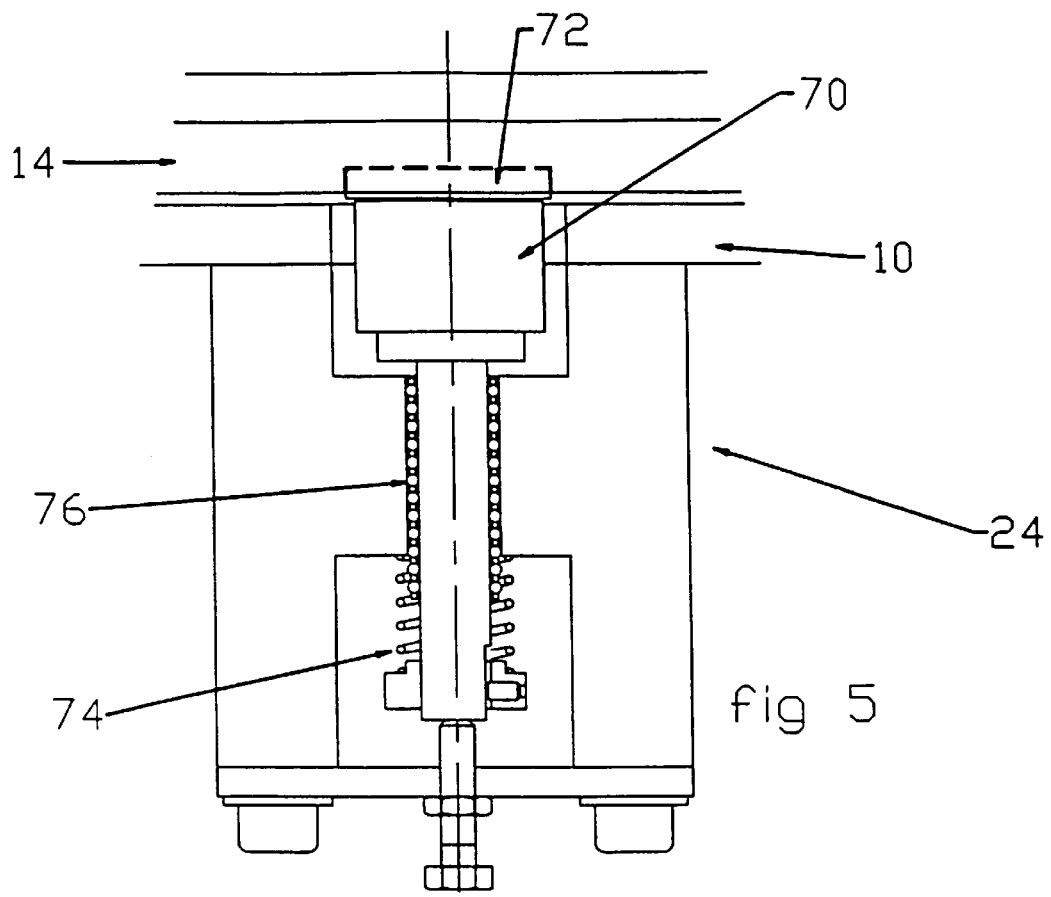
FIG. 5 is an elevational view of fastening means for securing artwork supports with respect to the supporting structure.

Now referring to FIG. 5, an embodiment example of the fastening device 24 of the lower supporting structure 10 with the frame 14 of the lower support 12 will be described. Identical devices could be used to secure the upper support 32 to the upper supporting structure 30. The immobilization system is essentially made up of an electromagnetic head 70 which, when it is activated, co-operates with a ferromagnetic plate 72 integral with the lower side of the frame 14 of the lower support 12. When activating the magnetic head 70, the lower supporting structure 10 becomes integral with the lower support 12. The electromagnetic head 70 is mounted via a resilient system 74 and a ball system 76. These fastening devices allow to maintain the rigorous positioning of the upper and lower supports during the lowering of the upper support to make a contact between the two artworks and the sides of the printed circuit 40.

The electromagnetic devices that have just been described are advantageous fastening means. However, to secure the support to the supporting structure, pressure systems or suction systems could also be used.

Figure 6:
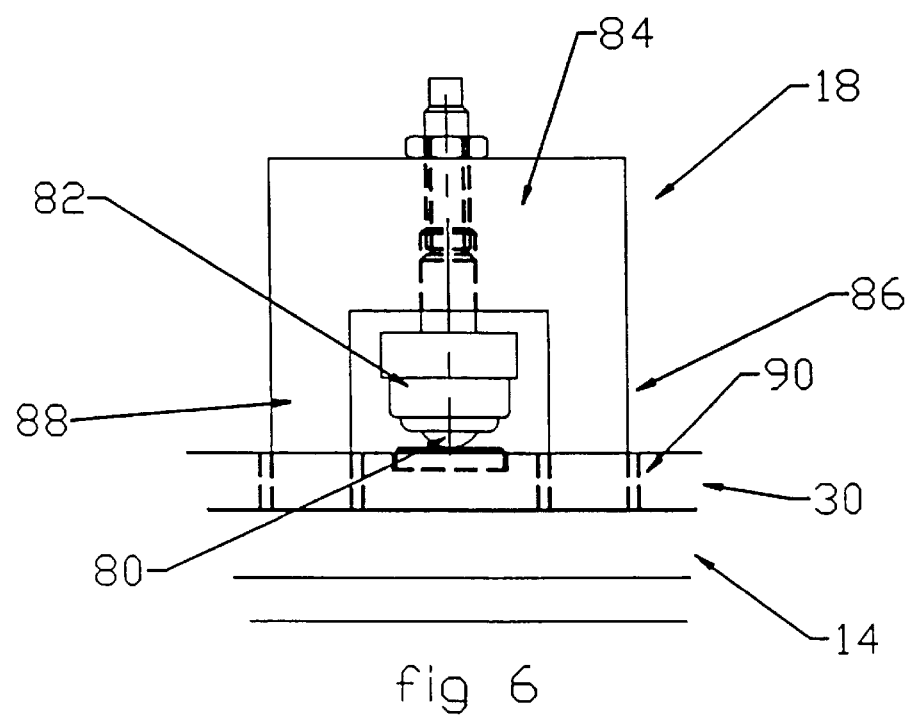
FIG. 6 is a detailed view showing supporting means for supporting the artwork support with the supporting structure.

Referring now to FIG. 6, an embodiment of supporting balls 18 allowing to support or to lift the support with respect to respective lower and upper supporting structures will be described. FIG. 6 shows a lifting device 18 that connects the frame 14' of the upper support 12' to the upper supporting structure 30. The ball system is essentially made up of a metal ball 80 mounted with in a cage 82 to form a toggle-joint. The cage 82 is connected by a clamping system 84 to the frame 14' of the upper support. To do this, the shafts 86 and 88 of the clamp go through the supporting structure 30 through holes such as 90. To ensure a better running and thus decrease the friction, the ball 80 co-operates with a running surface 92 integral with the upper side of the supporting structure 30.

When the frame of the lower support is being supported by the supporting structure, there is the same ball system but the axis of which is reversed such that the cage 82 of the ball 80 is integral with the lower supporting structure 10 and the ball co-operates with the lower side of the frame 14 of the lower support 12. Supporting the frame of the artwork support could also be achieved with air cushion devices.

Figure 7:
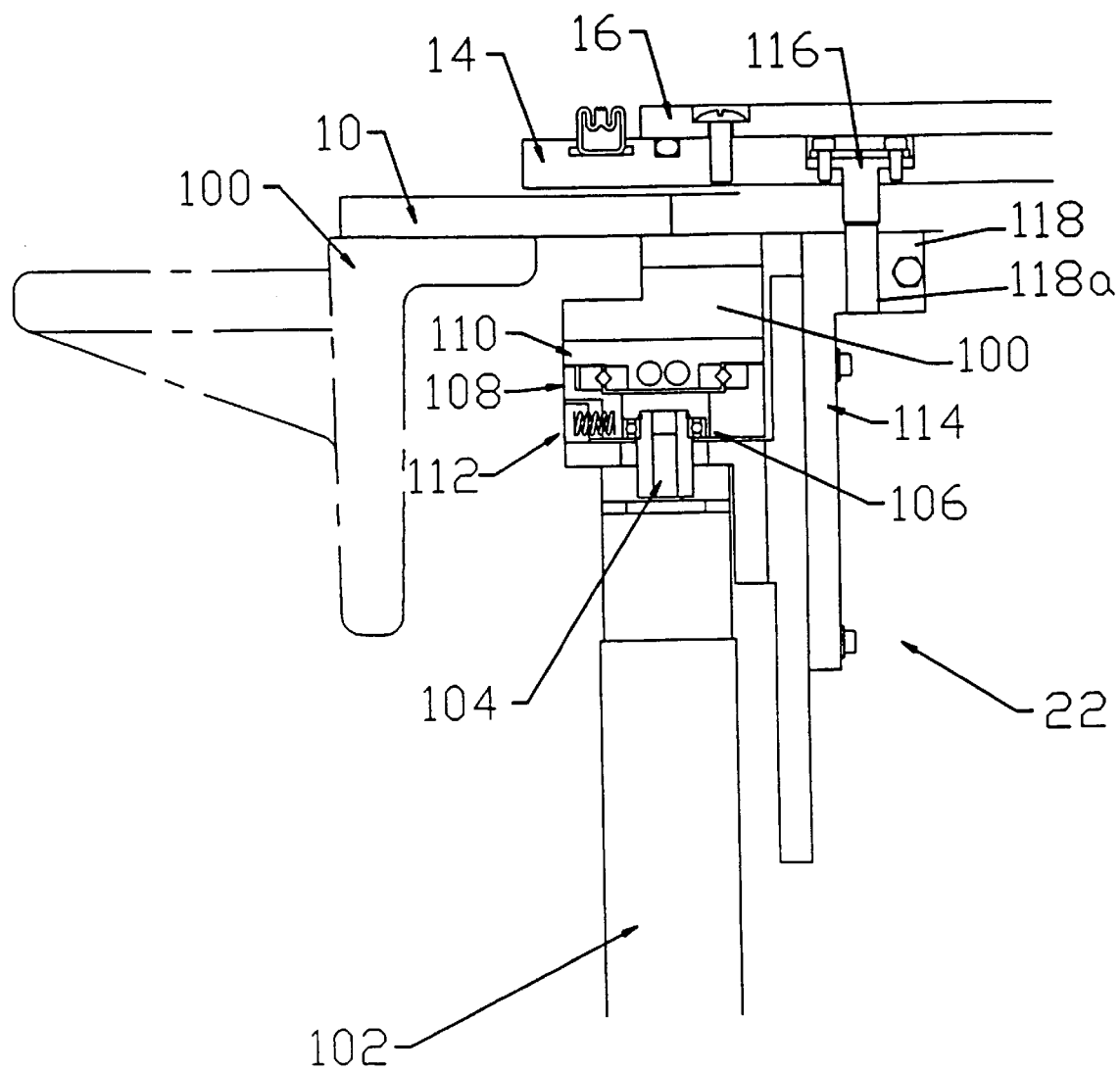
FIG. 7 is a detailed view showing an embodiment of the motors for moving the lower artwork support or the upper artwork support with respect to the fixed supporting structures.

Referring now to FIG. 7, a preferred embodiment of the moving devices 20 and 22 or 34 and 36 will be described which allows the final positioning of each support with respect to the corresponding supporting structure. FIG. 7 shows for example the displacement device 22 allowing a displacement in X and in Y of the lower support 12. Similar displacement systems are used in connection with the upper supporting structure 30. The displacement system 32 has a housing 100 integral with the supporting structure 10. For each displacement in X or in Y, there is a motor, for example 102 that is integral with the supporting structure 100. This motor has its shaft 104 which ends with a cam 106 allowing to move a first table 108 in the X direction. A second table 110 co-operating with the first table and combined with a second motor, integral with the first table and not shown in the figure, controls the displacement in the Y direction. With a mechanical transmission 112, 114, the combined displacement in X and Y is applied to the piece 18 which defines a calibrated vertical bore 118*a*. A vertical pin 116 integral with the frame 14 enters freely the bore 118*a* in the vertical direction but in the horizontal plane, the clearance between the pieces is very small but without any tightening. The pin could also be integral with the second table and the vertical bore could also be achieved in the frame 14 of the support.

What we claim is:

1. A device for exposing a double-sided printed circuit plate through a first and second artwork, comprising:

a first and a second supporting structure disposed in respective horizontal planes, at least one of said first and second supporting structure being selectively moveable in a vertical direction relative to said horizontal planes;

a first and second artwork support each having a surface adapted to hold respective ones of the first and second artworks, said first and second artwork supports being moveably coupled to said first and second supporting structures, respectively, said first and second artwork supports being further adapted to receive a printed circuit plate transported therebetween, at least one of said first and second supporting structure further including a holding device having an extendable member adapted to come into contact with said printed circuit plate and hold said printed circuit plate in a fixed position relative to each one of said first and second artwork supports;

a light source adapted to simultaneously illuminate each of said first and second artwork supports for exposure of both sides of said printed circuit plate through said first and second artworks; and an optical sensor adapted to detect respective positioning errors between said printed circuit plate and each one of said first and second artwork supports, each of said first and second artwork supports being independently moveable in a horizontal direction with respect to said printed circuit plate in response to said detected positioning errors.

2. The device of claim 1, wherein the holding device further comprises plural fingers provided integral with one of said first and second supporting structures, a corresponding one of said first and second artwork support having plural orifices permitting respective ones of said plural fingers to extend therethrough, said plural fingers being adapted to engage corresponding openings disposed in said printed circuit plate.

3. The device of claim 2, wherein an end portion of each of said plural fingers is expansible.

4. The device of claim 1, wherein the holding device further comprises at least one first pinching member disposed integral with the said supporting structure and at least one second pinching member disposed integral with said second supporting structure, respective ones of said at least one first and second pinching members facing one another in the vertical direction, said at least one first and second pinching members being moveable towards each other so as to pinch said printed circuit plate therebetween.

5. The device of claim 4, wherein said at least one first pinching member further comprises an end defining a flat horizontal pinching surface.

6. The device of claim 5, wherein said at least one second pinching member further comprises a vertically moveable rod having a sharp end adapted to selectively project into said pinching surface of said at least one first pinching member.

7. The device of claim 1, wherein said first supporting structure further comprises at least one motor adapted to move said first artwork support horizontally with respect to the said supporting structure and said second supporting structure further comprises at least one motor adapted to move said second artwork support horizontally with respect to said second supporting structure.

8. The device of claim 1, wherein said first and second supporting structures further comprises a substantially frictionless coupling to said first and second artwork supports, respectively.

9. The device of claim 1, wherein said first and second said artwork supports each include a glass disposed within a frame, said glass providing said surface, said first supporting structure including a plurality of balls interposed with said frame of said first artwork support.

10. The device of claim 9, wherein each of said first and second supporting structures further comprises an electromagnetic brake adapted to engage a corresponding ferromagnetic element disposed integral with said first and second artwork supports.

\* \* \* \* \*